US012599002B2

(12) United States Patent
Tang et al.

(10) Patent No.: US 12,599,002 B2
(45) Date of Patent: Apr. 7, 2026

(54) SUBSTRATE-INTEGRATED WAVEGUIDE

(71) Applicant: TEXAS INSTRUMENTS INCORPORATED, Dallas, TX (US)

(72) Inventors: Yiqi Tang, Allen, TX (US); Rajen Manicon Murugan, Dallas, TX (US); Juan Alejandro Herbsommer, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 358 days.

(21) Appl. No.: 17/733,921

(22) Filed: Apr. 29, 2022

(65) Prior Publication Data

US 2023/0352315 A1      Nov. 2, 2023

(51) Int. Cl.
H01L 21/48          (2006.01)
H01L 23/498        (2006.01)
(Continued)

(52) U.S. Cl.
CPC ........ H01L 21/4857 (2013.01); H01L 21/486 (2013.01); H01L 23/49822 (2013.01);
(Continued)

(58) Field of Classification Search
CPC ............... H01L 21/4857; H01L 21/486; H01L 23/49822; H01L 23/66; H01L 23/3121; H01L 24/16; H01L 2223/6616; H01L 2223/6627; H01L 2223/6677; H01L 2224/16227; H01L 23/49838;
(Continued)

(56) References Cited

U.S. PATENT DOCUMENTS 11,063,331 B1 *   7/2021   Wang .................... H01P 1/2086
11,189,895 B1 *  11/2021   Wang .................... H01P 1/2056
(Continued)

FOREIGN PATENT DOCUMENTS

CN          110137650 A       8/2019
WO        2009136945 A1     11/2009

OTHER PUBLICATIONS

PCT International Search Report, PCT/US2023/020182, mailed Aug. 22, 2023, 4 pages.
(Continued)

*Primary Examiner* — Karen Kusumakar
(74) *Attorney, Agent, or Firm* — Xiaotun Qiu; Frank D. Cimino

(57)          ABSTRACT

One example includes a method for fabricating a substrate-integrated waveguide (SIW). The method includes forming a first metal layer on a carrier surface. The first metal layer can extend along an axis. The method also includes forming a first metal sidewall extending from a first edge of the first metal layer along the axis and forming a second metal sidewall extending from a second edge of the first metal layer opposite the first edge along the axis to form a trough extending along the axis. The method also includes providing a dielectric material over the first metal layer and over the first and second metal sidewalls. The method further includes forming a second metal layer over the dielectric material and over the first and second metal sidewalls. The second metal layer can extend along the axis to enclose the SIW in all radial directions along the axis.

15 Claims, 5 Drawing Sheets

(51) Int. Cl.
  *H01L 23/66*  (2006.01)
  *H01L 23/00*  (2006.01)
  *H01L 23/31*  (2006.01)

(52) U.S. Cl.
  CPC .......... *H01L 23/66* (2013.01); *H01L 23/3121*
    (2013.01); *H01L 24/16* (2013.01); *H01L*
     *2223/6616* (2013.01); *H01L 2223/6627*
    (2013.01); *H01L 2223/6677* (2013.01); *H01L*
       *2224/16227* (2013.01)

(58) Field of Classification Search
  CPC ....... H01L 21/6835; H01L 2221/68359; H01L
              2224/81
  See application file for complete search history.

(56)        References Cited

U.S. PATENT DOCUMENTS

| | | | |
|---|---|---|---|
| 2014/0097917 | A1 | 4/2014 | Shah |
| 2016/0056860 | A1* | 2/2016 | Okada ...................... H04B 3/52 |
| | | | 375/257 |
| 2018/0191047 | A1* | 7/2018 | Huang .................. H01P 11/006 |
| 2018/0310399 | A1* | 10/2018 | Nair ........................ H01P 3/121 |
| 2019/0207290 | A1* | 7/2019 | Rawlings .............. H01P 11/002 |
| 2019/0305396 | A1* | 10/2019 | Dogiamis ............. H01P 1/2088 |
| 2021/0066219 | A1* | 3/2021 | Chen ................... H01L 23/5383 |
| 2022/0285810 | A1* | 9/2022 | Manzoni .............. H01P 1/2002 |

OTHER PUBLICATIONS

International Search Report and Written Opinion mailed Aug. 22, 2023, PCT Application No. PCT/CN2023/020182, 10 pages.

\* cited by examiner

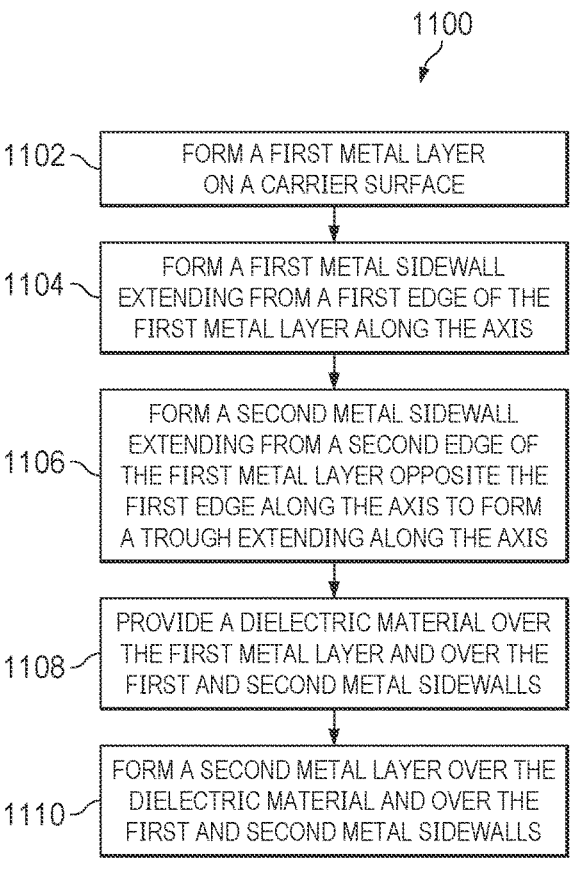

1100

1102 — FORM A FIRST METAL LAYER ON A CARRIER SURFACE

1104 — FORM A FIRST METAL SIDEWALL EXTENDING FROM A FIRST EDGE OF THE FIRST METAL LAYER ALONG THE AXIS

1106 — FORM A SECOND METAL SIDEWALL EXTENDING FROM A SECOND EDGE OF THE FIRST METAL LAYER OPPOSITE THE FIRST EDGE ALONG THE AXIS TO FORM A TROUGH EXTENDING ALONG THE AXIS

1108 — PROVIDE A DIELECTRIC MATERIAL OVER THE FIRST METAL LAYER AND OVER THE FIRST AND SECOND METAL SIDEWALLS

1110 — FORM A SECOND METAL LAYER OVER THE DIELECTRIC MATERIAL AND OVER THE FIRST AND SECOND METAL SIDEWALLS

FIG. 11

SUBSTRATE-INTEGRATED WAVEGUIDE

TECHNICAL FIELD

This description relates generally to communication systems, and more particularly to a substrate-integrated waveguide.

BACKGROUND

For high speed transmission and millimeter wave and antenna applications, transmission lines and waveguides are commonly used to transmit signals. A variety of different types of waveguides can be implemented to propagate wireless signals. One type of waveguide is a rectangular waveguide (e.g., having a rectangular cross-section), which is typically implemented for low signal loss properties. A type of rectangular waveguide is a substrate-integrated waveguide (SIW), which can be manufactured with a traditional laminated-based substrate. A typical SIW includes two parallel top and bottom planes connected by fencing vias. A wave can propagate along the typical SIW, but can suffer from the leakage through the spaces between the vias resulting in non-optimal insertion loss and crosstalk.

SUMMARY

One example includes a method for fabricating a substrate-integrated waveguide (SIW). The method includes forming a first metal layer on a carrier surface. The first metal layer can extend along an axis. The method also includes forming a first metal sidewall extending from a first edge of the first metal layer along the axis and forming a second metal sidewall extending from a second edge of the first metal layer opposite the first edge along the axis to form a trough extending along the axis. The method also includes providing a dielectric material over the first metal layer and over the first and second metal sidewalls. The method further includes forming a second metal layer over the dielectric material and over the first and second metal sidewalls. The second metal layer can extend along the axis to enclose the SIW in all radial directions along the axis.

Another example described herein includes an SIW formed from a multi-level package substrate (MLPS) fabrication process. The SIW includes a first metal layer extending along an axis and a first metal sidewall extending contiguously from a first edge of the first metal layer along the axis. The SIW also includes a second metal sidewall extending contiguously from a second edge of the first metal layer opposite the first edge along the axis and a second metal layer arranged over the first and second metal sidewalls and extending along the axis to enclose the SIW in all radial directions along the axis. The SIW also includes a dielectric material filling an inner volume between the first and second metal layers and the first and second metal sidewalls and being coupled to at least the first and second metal sidewalls external to the inner volume.

Another example described herein includes an integrated circuit (IC) package. The IC package includes a substrate and an IC die bonded to the substrate. The IC package also includes an SIW formed from a MLPS fabrication process. The SIW includes a first metal layer extending along an axis and a first metal sidewall extending contiguously from a first edge of the first metal layer along the axis. The SIW includes a second metal sidewall extending contiguously from a second edge of the first metal layer opposite the first edge along the axis and a second metal layer arranged over the first and second metal sidewalls and extending along the axis to enclose the SIW in all radial directions along the axis. The SIW also includes a dielectric material filling an inner volume between the first and second metal layers and the first and second metal sidewalls and being coupled to at least the first and second metal sidewalls external to the inner volume.

BRIEF DESCRIPTION OF THE DRAWINGS

FIG. 11 is an example of a method for fabricating an SIW.

DETAILED DESCRIPTION

This description relates generally to communication systems, and more particularly to a substrate-integrated waveguide (SIW). The SIW can be implemented in any of a variety of applications in which a wireless signal propagates in a waveguide, such as between an integrated circuit (IC) package and an antenna. The SIW can be fabricated from a multi-level package substrate (MLPS) fabrication process, such as a routable lead-frame (RLF) fabrication process, as described in greater detail herein.

The SIW can include a first metal layer extending along an axis. The axis can correspond to a propagation direction of the wireless signal therein. The SIW can also include a first metal sidewall extending contiguously from a first edge of the first metal layer along the axis and a second metal sidewall extending contiguously from a second edge of the first metal layer opposite the first edge along the axis. The SIW also includes a second metal layer arranged over the first and second metal sidewalls and extending along the axis to enclose the SIW in all radial directions along the axis. The SIW also includes a dielectric material filling an inner volume between the first and second metal layers and the first and second metal sidewalls. The SIW further includes a substrate (e.g., formed of the dielectric material) coupled to at least the first and second metal sidewalls external to the inner volume.

Because the SIW is formed from MLPS fabrication processes, the metal sidewalls can be formed as contiguous metal sidewalls from the edges of the first and metal layers with no gaps along the axis. Therefore, as described herein, the metal layers and the metal sidewalls completely enclose an inner volume of the SIW in 360 degrees between first and second ends of the SIW along the axis. Typical SIWs are formed from fabrication techniques that are unable to form the sidewalls as contiguous and gapless, and thus include fencepost vias that extend along the sides of the respective waveguide. Such fencepost vias exhibit leakage of RF energy through the spaces between such vias. However, because the SIW described herein has no gaps in the metal sidewalls along the axis, insertion losses can be mitigated in the SIW, as described herein.

Figure 1:
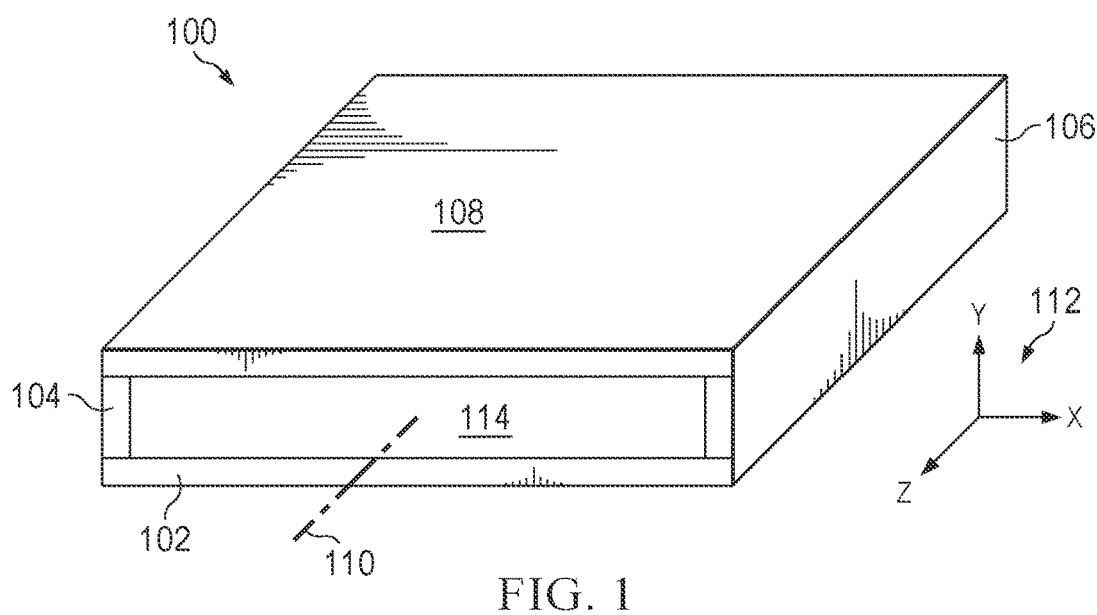
FIG. 1 is an example perspective view of a substrate-integrated waveguide (SIW).

FIG. 1 is an example perspective view of a substrate-integrated waveguide (SIW) 100. The SIW 100 can be implemented in any of a variety of communications applications in which a wireless signal propagates in a waveguide, such as between an integrated circuit (IC) package and an antenna. The SIW 100 includes a first metal layer 102, a first metal sidewall 104, a second metal sidewall 106, and a second metal layer 108. As an example, the first and second metal layers 102 and 108 and the first and second metal sidewalls 104 and 106 can be formed from any of a variety of conductive metals (e.g., copper). The first and second metal layers 102 and 108 and the first and second metal sidewalls 104 and 106 extend along an axis 110 along the Z-axis of the Cartesian coordinate system 112 that corresponds to a propagation direction of a wireless signal or wave through the SIW 100.

In the example of FIG. 1, the first and second metal sidewalls 104 and 106 extend between respective edges of the first and second metal layers 102 and 108 to enclose an inner volume of the SIW 100 in all radial directions between respective opposite ends along the axis Z. Therefore, there are no gaps in the first and second metal sidewalls 104 and 106 along the axis Z between the respective opposing ends of the axis Z. The inner volume of the SIW 100 is filled with a dielectric material 114 in the example of FIG. 1. As an example, the dielectric material 114 can be any of a variety of thermoplastic materials. The dielectric material 114 can also occupy regions around the SIW 100 exterior to the inner volume of the SIW 100 as part of a substrate, as described in greater detail herein.

In the example of FIG. 1, the first and second metal sidewalls 104 and 106 are demonstrated as contiguous and solid between the first and second metal layers 102 and 108. As an example, and as described in greater detail herein, the SIW 100 can be formed from a multi-level package substrate (MLPS) fabrication process to facilitate formation of the contiguous metal sidewalls 104 and 106. Therefore, because the first and second metal sidewalls 104 and 106 have no gaps along the axis Z, as opposed to a typical SIW that includes fencepost vias extending along the sides of the respective waveguide, the SIW 100 does not exhibit leakage through spaces in the first and second metal sidewalls 104 and 106. In other words, the SIW 100 does not exhibit leakage of RF energy outside of the first and second metal sidewalls 104 and 106, as opposed to a typical SIW in which RF energy leaks out through the spaces between fencepost vias. As a result, insertion losses can be mitigated in the SIW 100 described herein.

The SIW 100 can be fabricated at specific dimensions to facilitate wave propagation of a specific frequency band of a wireless signal therein. For example, the first and second metal layers 102 and 108 and the first and second metal sidewalls 104 and 106 can be formed to have specific respective thicknesses to tune a desired frequency band of operation of the SIW 100. As another example, the first and second metal layers 102 and 108 can be formed to have a specific width along the X-axis of the Cartesian coordinate system 112 and the first and second metal sidewalls 104 and 106 can be formed to have a specific height along the Y-axis of the Cartesian coordinate system 112 to tune the desired frequency band of operation of the SIW 100. Thus, by tuning the dimensions of the SIW 100 during the fabrication process, the cutoff frequency of the SIW 100 can be defined to provide for an operational frequency band of the SIW 100.

As an example, the SIW 100 can be fabricated to exhibit a cutoff frequency $fc_{nm}$ based on the following equation:

$$f_{c_{mn}} = \frac{k_c}{2\pi\sqrt{\mu\epsilon}} = \frac{1}{2\pi\sqrt{\mu\epsilon}}\sqrt{\left(\frac{m\pi}{a}\right)^2 + \left(\frac{n\pi}{b}\right)^2} \qquad \text{Equation 1}$$

Where: $\mu$ is a permeability of the dielectric material 114;
    c is a permittivity of the dielectric material 114;
    a is a width of the SIW 100 (along the X-axis);
    b is a height of the SIW 100 (along the Y-axis);
    $k_c$ is a phase propagation constant; and
    m, n are the modes of the wireless signal propagating
      in the SIW 100.

As described herein, the SIW 100 can be formed in a substrate. As an example, the SIW 100 can be coupled to an IC (e.g., flip chip) die to form an IC package (e.g., quad-flat no lead (QFN)). For example, the SIW 100 can provide communicative coupling between a waveguide formed on a printed circuit board (PCB) and an antenna or signal source formed on the IC. As an example, the IC die can be soldered onto the substrate (e.g., via solder pads) or bonded in a variety of other ways to couple the IC die and the substrate that includes the SIW 100. Therefore, the SIW 100 can facilitate propagation of a wireless signal that is provided to or from the IC.

The examples of FIGS. 2-9 demonstrate an example of fabrication of the SIW 100. As described herein, the examples of FIGS. 2-9 are described based on an MLPS fabrication process. However, other fabrication processes can be implemented for fabricating the SIW 100.

Figure 2:
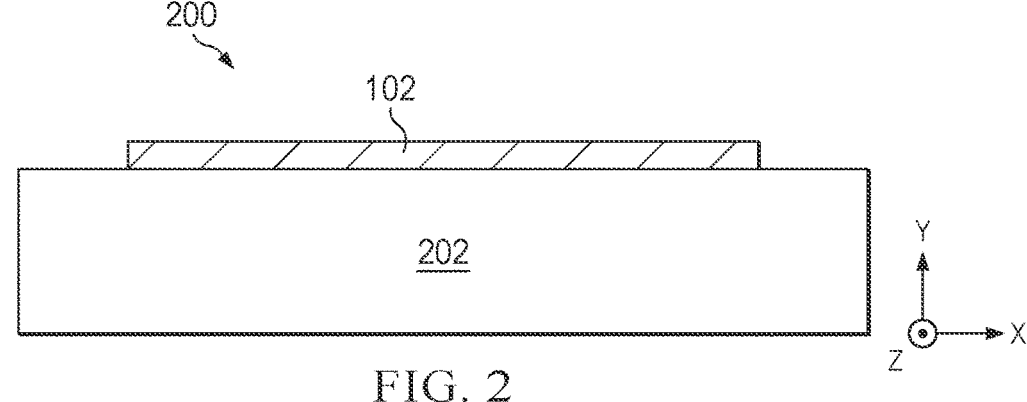
FIG. 2 is an example of a first fabrication step in forming an SIW.

FIG. 2 is an example of a first fabrication step 200 in forming the SIW 100. The first fabrication step 200 demonstrates forming the first metal layer 102 on a carrier surface 202. For example, the first metal layer 102 can be any of a variety of conductive metals (e.g., copper) that is provided on the carrier surface via a metal plating process (e.g., as provided in a MLPS (e.g., RLF) fabrication process), such as beginning with a metal seed layer and forming additional metal plating thereupon. However, other types of fabrication processes (e.g., deposition, etched from a solid metal layer, printed, etc.) can instead be implemented. As an example, the carrier surface 202 can correspond to a metal surface on which SIW 100 is formed, after which the SIW 100 is removed from the carrier surface 202, as described in greater detail herein. The first metal layer 102 can be formed longitudinally to extend along the Z-axis. As an example, the first metal layer 102 can have a thickness and a width along the X-axis that can define the operational frequency band of the SIW 100.

Figure 3:
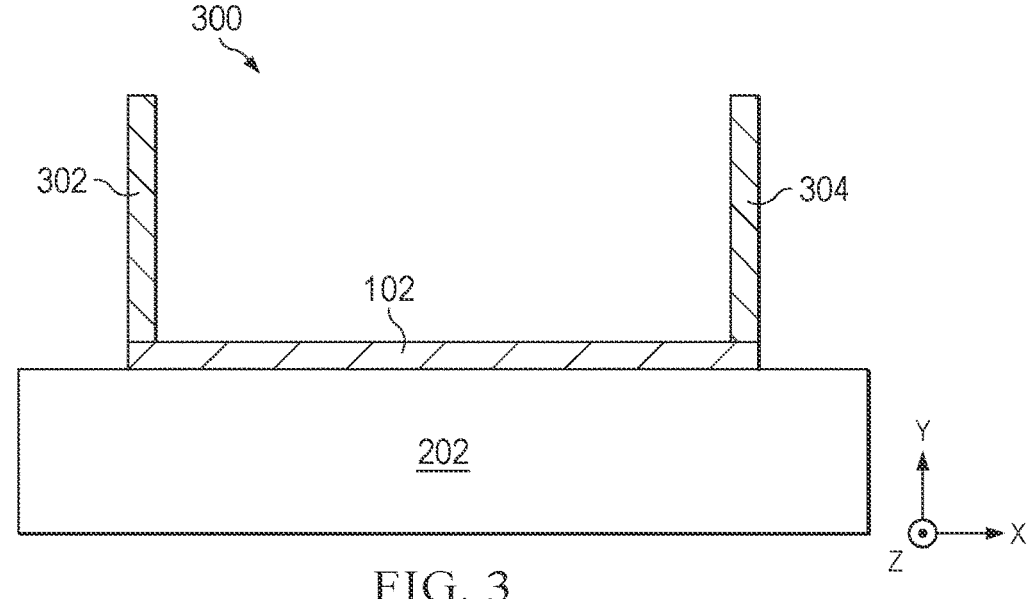
FIG. 3 is an example of a second fabrication step in forming an SIW.

FIG. 3 is an example of a second fabrication step 300 in forming the SIW 100. The second fabrication step 300 demonstrates forming a first metal sidewall portion 302 and a second metal sidewall portion 304 on each of respective opposite edges of the first metal layer 102. The first and second metal sidewall portions 302 and 304 can be the same conductive metal as the first metal layer 102, and can thus be formed integral with the first metal layer 102. For example, the first and second metal sidewall portions 302 and 304 can be formed based on a same metal plating process (e.g., as provided in a MLPS fabrication process) as the first metal layer 102, but without an initial metal seed layer given that the first and second metal sidewall portions 302 and 304 are formed on the first metal layer 102. As described herein, the first and second metal sidewall portions 302 and 304 form the first and second metal sidewalls 104 and 106 in a later fabrication step. Therefore, the first and second metal sidewall portions 302 and 304 extend along the Z-axis to form a trough with respect to the first metal layer 102. Similar to as described above, the first and second metal sidewall portions 302 and 304 can each have a thickness that can define the operational frequency band of the SIW 100.

Figure 4:
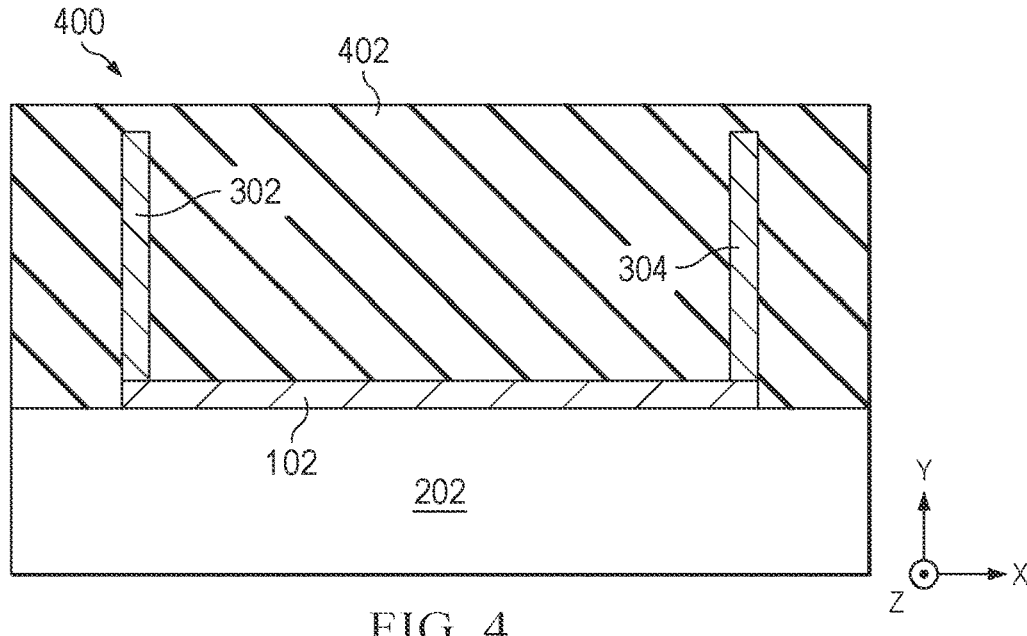
FIG. 4 is an example of a third fabrication step in forming an SIW.

FIG. 4 is an example of a third fabrication step 400 in forming the SIW 100. The third fabrication step 400 demonstrates depositing a dielectric material 402 over the carrier surface 202, and therefore over the first metal layer 102 and the first and second metal sidewall portions 302 and 304. As an example, the dielectric material 402 can be a thermoplastic material that is compression molded over the first metal layer 102 and the first and second metal sidewall portions 302 and 304. As described in greater detail herein, the dielectric material 402 can correspond to the dielectric material 114 that is enclosed within the SIW.

Figure 5:
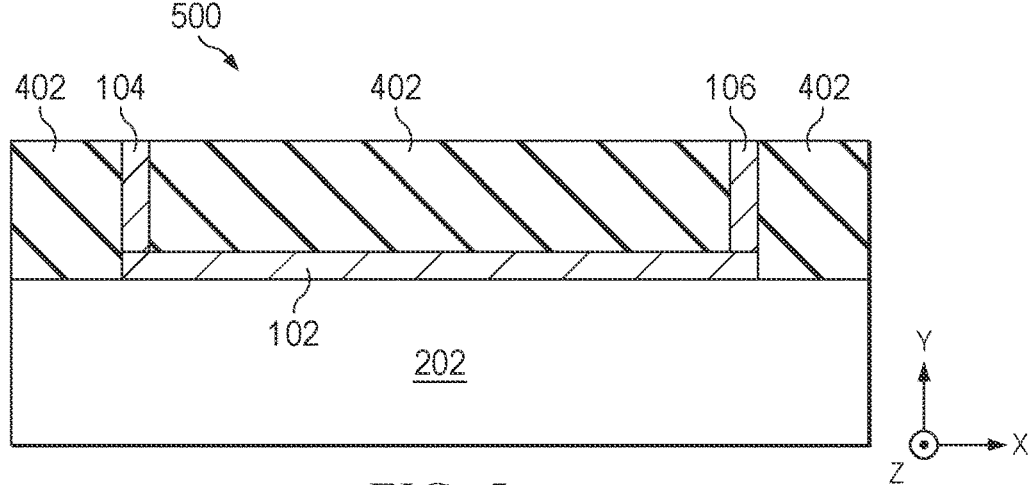
FIG. 5 is an example of a fourth fabrication step in forming an SIW.

FIG. 5 is an example of a fourth fabrication step 500 in forming the SIW 100. The fourth fabrication step 500 demonstrates grinding down the dielectric material 402 and the first and second metal sidewall portions 302 and 304. The grinding down of the dielectric material 402 and the first and second metal sidewall portions 302 and 304 can be provided via mechanical grinding (e.g., a sanding disc), as provided in a MLPS fabrication process. The grinding down of the dielectric material 402 and the first and second metal sidewall portions 302 and 304 can reduce a height of the first and second metal sidewall portions 302 and 304 to set a height of the resultant first and second metal sidewalls 104 and 106. For example, the height of the first and second metal sidewall portions 302 and 304 can be grinded down to set a height of the resultant first and second metal sidewalls 104 and 106 along the Y-axis to tune the desired frequency band of operation of the SIW 100. Additionally, by grinding down the dielectric material 402 and the first and second metal sidewall portions 302 and 304, the top surfaces of the first and second metal sidewall portions 302 and 304 can be exposed and level with the top of the dielectric material 402.

Figure 6:
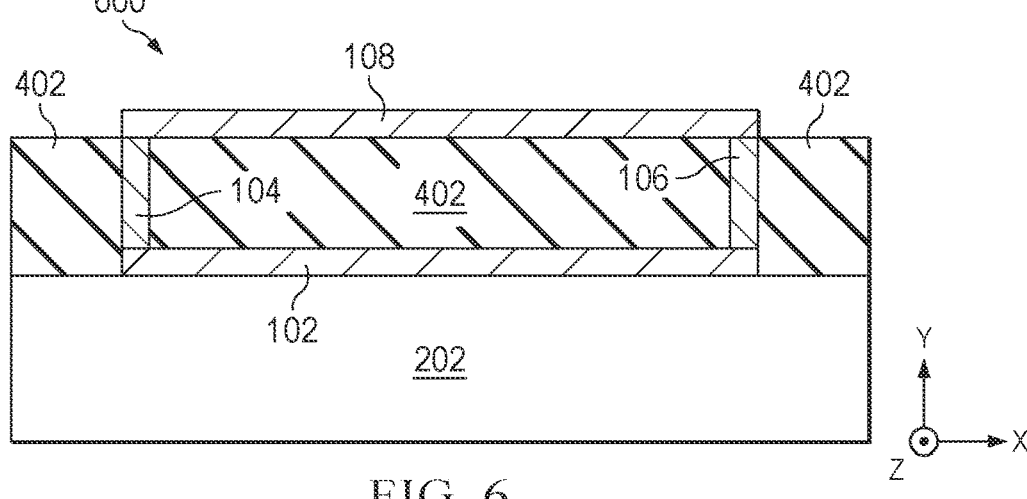
FIG. 6 is an example of a fifth fabrication step in forming an SIW.

FIG. 6 is an example of a fifth fabrication step 600 in forming the SIW 100. The fifth fabrication step 600 demonstrates forming the second metal layer 108 over the exposed respective top surfaces of first and second metal sidewall portions 302 and 304 and over the portion of the dielectric material 402 between the first and second metal sidewall portions 302 and 304. The second metal layer 108 can be the same conductive metal as the first metal layer 102 and the first and second metal sidewall portions 302 and 304, and can thus be formed integral with the first metal layer 102 and the first and second metal sidewall portions 302 and 304. As an example, the second metal layer 108 can be formed in the same manner as the first metal layer 102 in the first fabrication step 200 (e.g., metal plating as provided in a MLPS fabrication process). Therefore, the second metal layer 108 can have a thickness and a width along the X-axis that can define the operational frequency band of the SIW 100.

Figure 7:
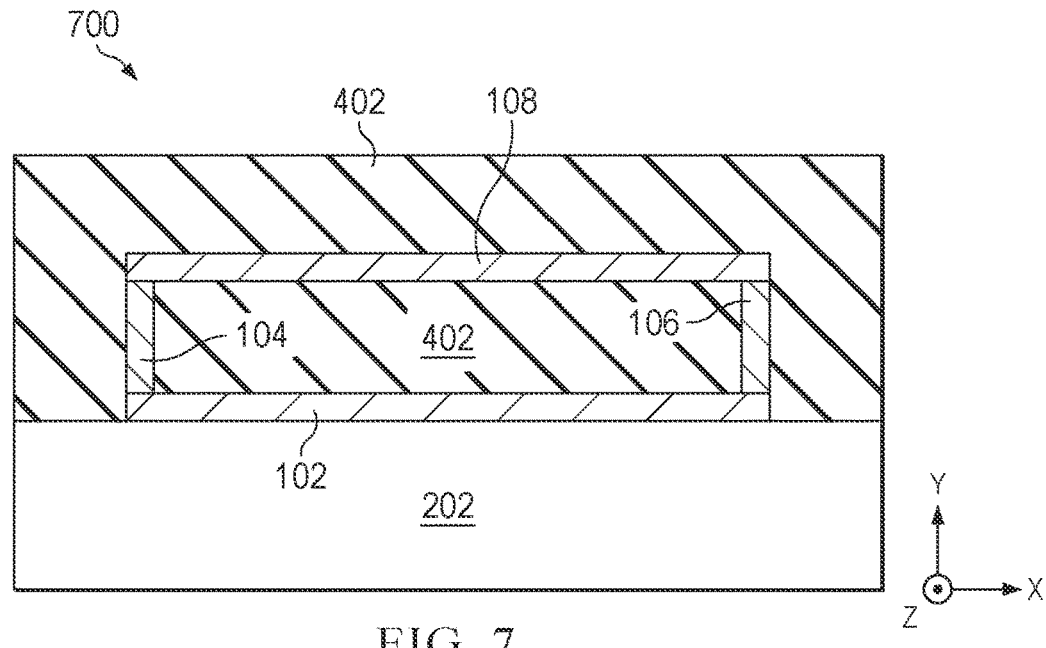
FIG. 7 is an example of a sixth fabrication step in forming an SIW.

FIG. 7 is an example of a sixth fabrication step 700 in forming the SIW 100. The sixth fabrication step 700 demonstrates depositing more of the dielectric material 402 over the existing dielectric material 402 and over the second metal layer 108. It is noted that the sixth fabrication step 700, as well as the following seventh fabrication step 800, are only necessary for leveling the external dielectric material 402 with respect to a top surface of the second metal layer 108. Otherwise, one or both of the fabrication steps 700 and 800 can be omitted.

Figure 8:
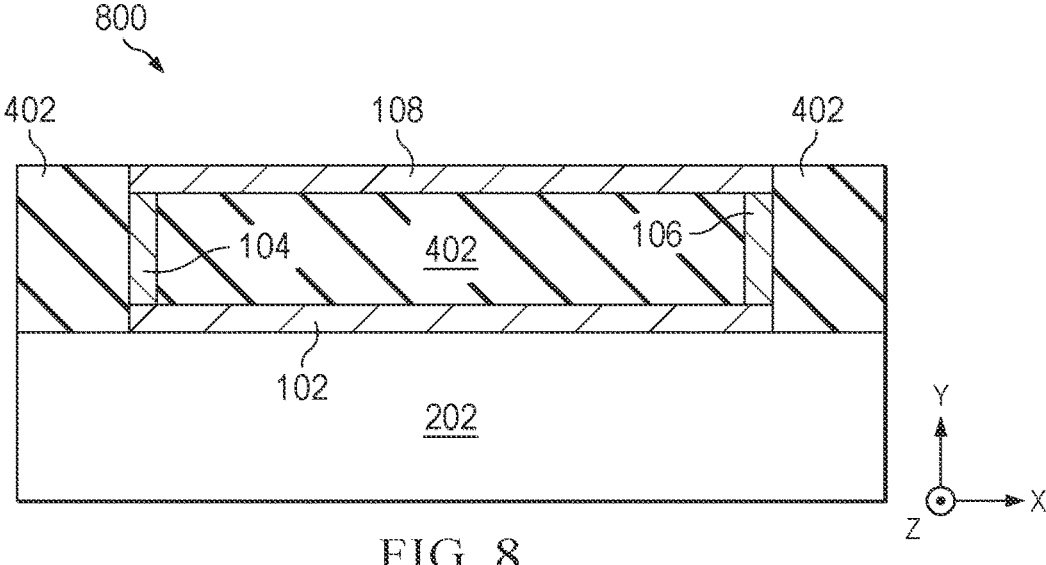
FIG. 8 is an example of a seventh fabrication step in forming an SIW.

FIG. 8 is an example of a seventh fabrication step 800 in forming the SIW 100. The seventh fabrication step 800 demonstrates grinding down the dielectric material 402 to level the dielectric material 402 with the top surface of the second metal layer 108, thereby exposing the top surface of the second metal layer 108. Therefore, the dielectric material 402 outside of the inner volume enclosed by the first and second metal layers 102 and 108 and the first and second metal sidewalls 104 and 106 has a same thickness along the Y-axis as the first and second metal sidewalls 104 and 106.

Figure 9:
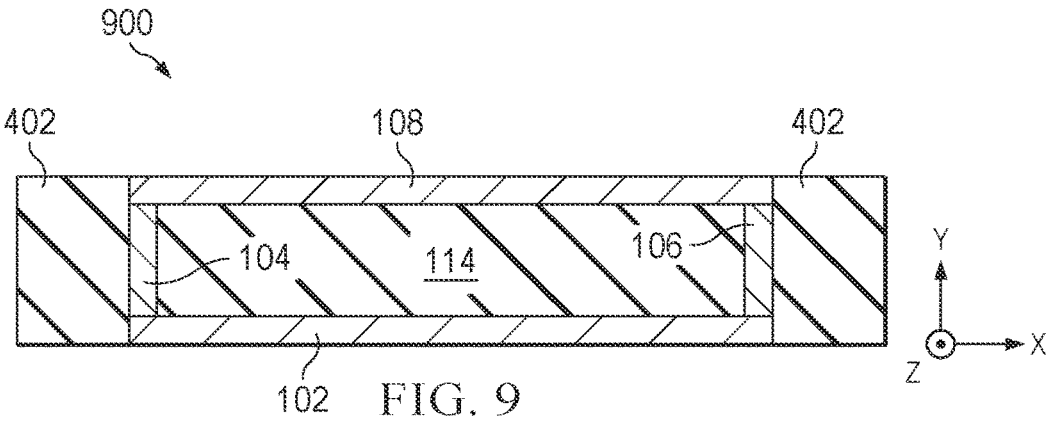
FIG. 9 is an example of an eighth fabrication step in forming an SIW.

FIG. 9 is an example of an eighth fabrication step 900 in forming the SIW 100. The eighth fabrication step 900 demonstrates removal of the finished SIW 100 from the carrier surface 202. The separation of the finished SIW 100 from the carrier surface 202 can be accomplished by any of a variety of mechanical separation techniques, as are typical in substrate fabrication processes. Therefore, the eighth fabrication step 900 demonstrates the SIW 100 that includes the first and second metal layers 102 and 108, the first and second metal sidewalls 104 and 106, the dielectric material 114 enclosed in the inner volume within the first and second metal layers 102 and 108 and the first and second metal sidewalls 104 and 106, and the dielectric material 402 outside of the inner volume that forms part of the substrate. Additional fabrication steps can be included to fabricate additional portions of an associated circuit on the substrate, such as integrated with the SIW 100.

Figure 10:
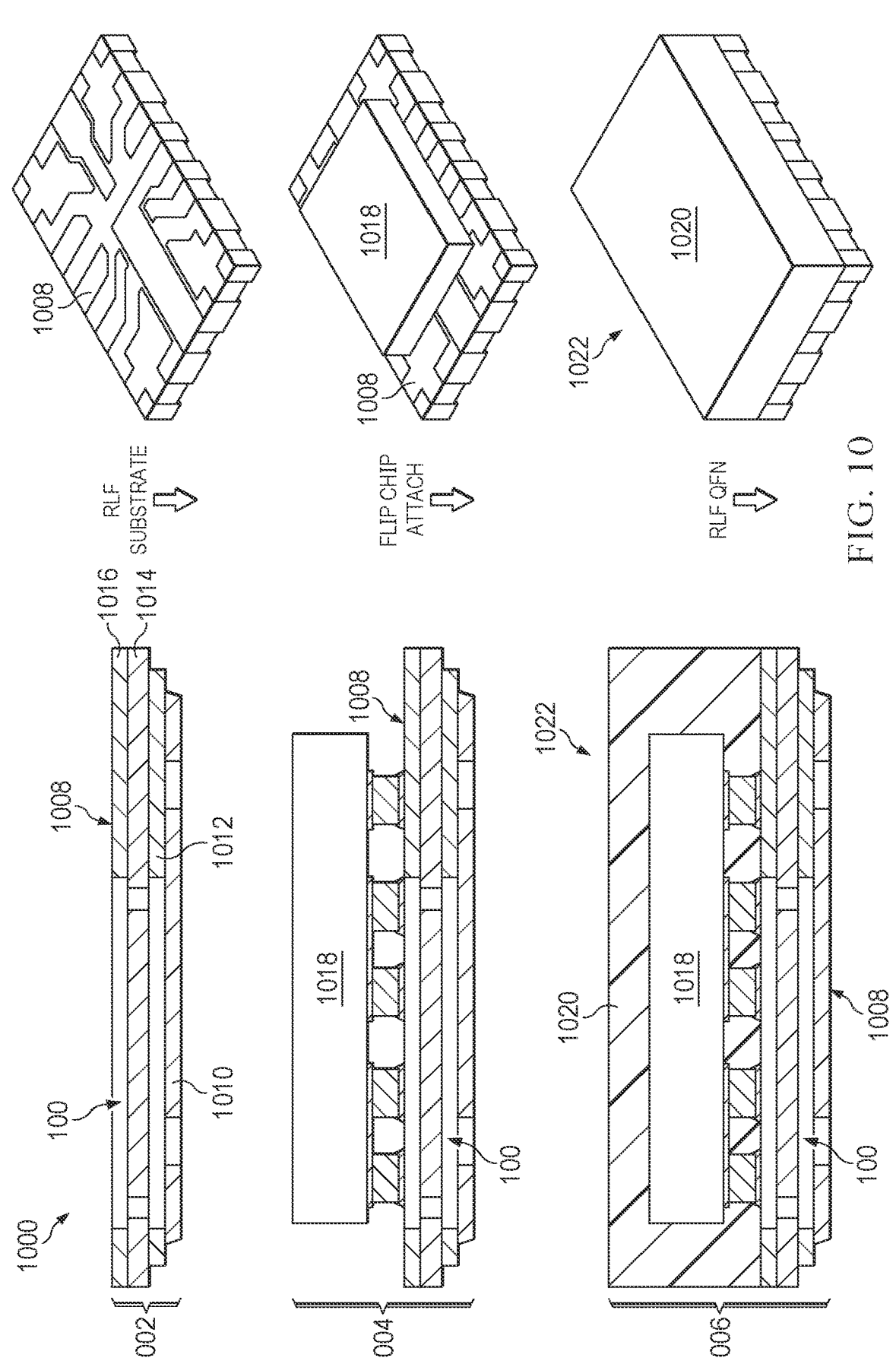
FIG. 10 is an example diagram of coupling an SIW to an IC die to form an IC package.

FIG. 10 is an example diagram 1000 of coupling an SIW to an IC die to form an IC package. The diagram 1000 includes a first step 1002, a second step 1004, and a third step 1006. The first step 1002 demonstrates a substrate 1008, demonstrated in both a side view and a perspective view. The substrate 1008 includes the SIW 100, such as fabricated in the examples of FIGS. 1-9. The substrate 1008 is demonstrated as including a first layer 1010, a second layer 1012, a third layer 1014, and a fourth layer 1016. The first layer 1010 can be arranged as a dielectric layer, and can include solder pads (not shown), such as for soldering the IC package to a printed circuit board (PCB). The second layer 1012 can include the first metal layer 102 and dielectric material, the third layer 1014 can include the first and second metal sidewalls 104 and 106 and dielectric material (therebetween and outside of the SIW 100), and the fourth layer 1016 can include the second metal layer 108 and dielectric material. As an example, the substrate 1008 can include additional components (not shown), such as one or more transitions that are coupled to the SIW 100 to propagate the wireless signal between a printed circuit board (PCB) and an antenna that can be formed on the resultant IC package.

The second step 1004 of the diagram 1000 demonstrates the bonding of an IC die 1018 to the substrate 1008. As an example, the IC die 1018 can be soldered to the substrate 1008, such as based on solder pads on a top surface of the substrate 1008. For example, the IC die 1018 can be flip-chip attachment to the substrate 1008. As an example, the IC die 1018 can include an antenna (e.g., as formed by an antenna-on-package (AoP) fabrication process). Thus, the antenna on the IC die 1018 can be communicatively coupled with the SIW 100 through the process of bonding the IC die 1018 to the substrate 1008.

The third step 1006 of the diagram 1000 demonstrates forming packaging material 1020 over the IC die 1018 and on the substrate 1008 to form an IC package 1022. As an example, the packaging material 1020 can include an exterior plastic package and molding material formed within the exterior plastic package to surround the IC die 1018 and cover at least a portion of the top surface of the substrate 1008. As an example, the IC package 1022 can be formed as a quad flat no lead (QFN) package. Accordingly, the IC package 1022 can be incorporated in a communication system.

In view of the foregoing structural and functional features described above, a methodology in accordance with various aspects of the disclosure will be better appreciated with reference to FIG. 11. It is to be understood and appreciated that the method of FIG. 11 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 11 illustrates an example of a method 1100 for fabricating an SIW (e.g., the SIW 100). At 1102, a first metal layer (e.g., the first metal layer 102) is formed on a carrier surface (e.g., the carrier surface 202). The first metal layer extends along an axis (e.g., the axis 110). At 1104, a first metal sidewall (e.g., the first metal sidewall 104) is formed extending from a first edge of the first metal layer along the axis. At 1106, a second metal sidewall (e.g., the second metal sidewall 106) is formed extending from a second edge of the first metal layer opposite the first edge along the axis to form a trough extending along the axis. At 1108, a dielectric material (e.g., the dielectric material 402) is provided over the first metal layer and over the first and second metal sidewalls. At 1110, a second metal layer (e.g., the second metal layer 108) is formed over the dielectric material and over the first and second metal sidewalls. The second metal layer extends along the axis to enclose the SIW in all radial directions along the axis.

In this description, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

The techniques described in this disclosure may also be embodied or encoded in an article of manufacture including a non-transitory computer-readable storage medium. Example non-transitory computer-readable storage media may include random access memory (RAM), read-only memory (ROM), programmable ROM, erasable programmable ROM, electronically erasable programmable ROM, flash memory, a solid-state drive, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

Modifications are possible in the described embodiments, and other embodiments are possible, within the scope of the claims.

What is claimed is:

1. A method for fabricating a substrate-integrated waveguide (SIW), comprising:
   forming a first metal layer on a carrier substrate, the first metal layer extending along an axis;
   forming a first metal sidewall at a first edge of the first metal layer extending along the axis;
   forming a second metal sidewall at a second edge of the first metal layer opposite the first edge extending along the axis;
   providing a dielectric material on the first metal layer and between the first and second metal sidewalls;
   forming a second metal layer over the dielectric material and over the first and second metal sidewalls, the second metal layer extending along the axis; and
   removing the carrier substrate.

2. The method of claim 1, wherein the first metal sidewall and the second metal sidewall are each continuous structure between the first metal layer and the second metal layer at the respective first and second edges of the first metal layer.

3. The method of claim 1, wherein forming the first metal layer, forming the first metal sidewall, forming the second metal sidewall, providing the dielectric material, and forming the second metal layer comprise forming the first metal layer, forming the first metal sidewall, forming the second metal sidewall, providing the dielectric material, and forming the second metal layer in a multi-level package substrate (MLPS) fabrication process.

4. The method of claim 1, further comprising grinding the dielectric material and the first and second metal sidewalls down to a first height to tune a frequency band of operation of the SIW.

5. The method of claim 1, wherein forming the first metal layer, forming the first metal sidewall, forming the second metal sidewall, and forming the second metal layer comprise forming the first metal layer, forming the first metal sidewall, forming the second metal sidewall, and forming the second metal layer at specific respective dimensions to tune a frequency band of operation of the SIW.

6. The method of claim 1, wherein forming the first metal layer and the second metal layer comprises forming the first metal layer and the second metal layer at a first width to tune a frequency band of operation of the SIW, and wherein forming the first metal sidewall and the second metal sidewall comprises forming the first metal sidewall and the second metal sidewall at a first height to tune the frequency band of operation of the SIW.

7. The method of claim 1, wherein the first metal layer, the first metal sidewall, the second metal sidewall, and the second metal layer comprise copper, and wherein the dielectric material comprises a thermoplastic material.

8. The method of claim 1, wherein the SIW is formed in a substrate, the method further comprising coupling an integrated circuit (IC) die to the substrate.

9. A method for fabricating an integrated circuit (IC) package, comprising:

forming a substrate-integrated waveguide (SIW), comprising
    forming a first metal layer on a carrier substrate, the first metal layer extending along an axis;
    forming a first metal sidewall at a first edge of the first metal layer extending along the axis;
    forming a second metal sidewall at a second edge of the first metal layer opposite the first edge extending along the axis;
    providing a dielectric material on the first metal layer and between the first and second metal sidewalls;
    forming a second metal layer over the dielectric material and over the first and second metal sidewalls, the second metal layer extending along the axis; and
  removing the carrier substrate; and
  coupling an IC die to the SIW.

10. The method of claim 9, wherein the first metal sidewall and the second metal sidewall are each continuous structure between the first metal layer and the second metal layer at the respective first and second edges of the first metal layer.

11. The method of claim 9, wherein forming the SIW further comprises grinding the dielectric material and the first and second metal sidewalls down to a first height to tune a frequency band of operation of the SIW.

12. The method of claim 9, wherein forming the first metal layer and the second metal layer comprises forming the first metal layer and the second metal layer at a first width to tune a frequency band of operation of the SIW, and wherein forming the first metal sidewall and the second metal sidewall comprises forming the first metal sidewall and the second metal sidewall at a first height to tune the frequency band of operation of the SIW.

13. The method of claim 9, wherein the first metal layer, the first metal sidewall, the second metal sidewall, and the second metal layer comprise copper, and wherein the dielectric material comprises a thermoplastic material.

14. The method of claim 9, further comprising using a mold compound to cover the IC die and the SIW.

15. The method of claim 9, wherein the IC package is arranged as a quad flat no lead (QFN) package.

* * * * *